(12) United States Patent
Hunter

(10) Patent No.: US 7,466,198 B1
(45) Date of Patent: Dec. 16, 2008

(54) DIFFERENTIAL GAIN BOOSTED AMPLIFIER

(75) Inventor: Bradford Lawrence Hunter, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/105,479

(22) Filed: Apr. 18, 2008

(51) Int. Cl.
*H03F 3/45* (2006.01)

(52) U.S. Cl. .................. 330/253; 330/257; 330/258; 330/261

(58) Field of Classification Search ......... 330/253–255, 330/257, 258, 260, 261
See application file for complete search history.

(56) References Cited

U.S. PATENT DOCUMENTS

| | | | |
|---|---|---|---|
| 4,480,230 A | 10/1984 | Brehmer et al. | |
| 5,442,318 A | * 8/1995 | Badyal et al. | 330/258 |
| 5,748,040 A | * 5/1998 | Leung | 330/253 |
| 6,114,907 A | 9/2000 | Sakurai | |
| 6,353,361 B1 | * 3/2002 | Sun | 330/253 |
| 6,496,066 B2 | 12/2002 | Colonna et al. | |
| 6,525,608 B2 | 2/2003 | Krupnik | |
| 6,590,452 B1 | 7/2003 | van Rhijn | |
| 6,636,098 B1 | 10/2003 | Kizer | |
| 6,639,431 B1 | 10/2003 | Potter | |
| 6,784,500 B2 | 8/2004 | Lemkin | |
| 7,088,178 B1 | 8/2006 | Rosenfeld et al. | |
| 7,116,172 B2 | 10/2006 | Siniscalchi | |
| 7,154,332 B2 | 12/2006 | Tsuchi | |
| 7,187,235 B2 | 3/2007 | Moon | |
| 7,193,466 B2 | 3/2007 | Kim et al. | |

OTHER PUBLICATIONS

Article: Wang, et al., "Analysis and Design of Fully Differential Gain-Boosted Telescopic Cascode Opamp", Institute of Microelectronics of Chinese Academy of Sciences, Beijing, 100029, China—2004 IEEE.
Article: Lloyd, et al., "A CMOS op amp with fully-differential gain-enhancement", Microsystems Technol. Lab., MIT, Cambridge, MA—Mar. 1994, vol. 41, Issue 3. [Abstract].

* cited by examiner

*Primary Examiner*—Khanh V Nguyen
(74) *Attorney, Agent, or Firm*—McGinn IP Law Group, PLLC

(57) ABSTRACT

A differential gain boosted amplifier is provided. The differential amplifier includes at least one current mirror, at least one differential pair, at least one cascode, at least one differential gain boosting amplifier for differential current mirror voltage control, and at least one common mode amplifier comprising a common mode voltage to control the output common mode of the differential gain boosting amplifier. The common mode voltage includes a mirrored bias voltage. The mirrored bias voltage feeds directly into the common mode amplifier. A differential input voltage feeds directly into the differential gain boosting amplifier and the differential pair. A gain of the current mirror is boosted by the differential gain boosting amplifier. A differential output voltage is indicative of the differential input voltage with an increase in gain. The differential output voltage is connected to the cascode.

1 Claim, 3 Drawing Sheets

DIFFERENTIAL GAIN BOOSTED AMPLIFIER

BACKGROUND OF THE INVENTION

1. Field of the Invention

The present invention generally relates to a differential amplifier, and more specifically to a common mode controlled differential gain boosting amplifier where the common mode voltage includes a mirrored voltage.

2. Description of the Related Art

In analog applications, where accuracy is important (i.e. analog to digital converters), ultra-high gain op-amplifiers are often a necessity. Maintaining op-amplifier loop stability is challenging in an ultra-high gain and high accuracy amplifier. Balancing speed with stability creates an immediate trade-off in performance versus accuracy. Single stage folded cascode amplifiers are easy to stabilize but do not offer ultra-high gain. Differential gain boosting amplifiers can offer an order of magnitude increase in the gain of a single stage cascoded op-amplifier. In prior art, differential gain boosting is limited to cascoded devices.

FIG. 1 shows a conventional fully complementary folded cascode amplifier with differential gain boosting amplifiers. $Vin_p$ and $Vin_n$ represent input voltages for both an n-MOS differential pair 1 and a p-MOS differential pair 2. $Vin_p$ and $Vin_n$ are fully differential with respect to each other. A $Vtail_n$ transistor and a $Vtail_p$ transistor respectively complete the n-MOS 1 and p-MOS 2 differential pairs. $Vsrc_p$ and $Vsrc_n$ are both DC bias voltages connected respectively to gates of p-MOS transistors and n-MOS transistors creating a p-MOS current source 3 and an n-MOS current source 4. The gate voltages of the p-MOS 3 and n-MOS 4 current sources do not move.

$Vout_p$ and $Vout_n$ are output voltages of the circuit and are indicative of $Vin_p$ and $Vin_n$ with an increase in gain. $Vout_p$ and $Vout_f$ are each connected to a p-MOS cascode 5 and an n-MOS cascode 10. The n-MOS cascodes 10 and the p-MOS cascodes 5 are connected respectively to the n-MOS current source 4 and the p-MOS current source 3. The cascodes increases the gain on $Vout_p$ and $Vout_n$.

$Vb_p$ and $Vb_n$ represent bias voltages that would traditionally connect directly to the cascode gates. $Vb_p$, $Vb_n$, $Vsrc_n$, and $Vsrc_p$ are all generated from reference currents.

Common mode feedback amplifiers 6 and 8 and fully differential high gain amplifiers 7 and 9 are included in this circuit. The common mode feedback amplifier 6 sets the common mode voltage around which the amplifier 7 swings to $Vb_n$. The common mode feedback amplifier 8 sets the common mode voltage around which amplifier 9 swings to $Vb_p$. The gates of the cascodes 5, 10 are connected to the output of the amplifiers 7, 9 and the inputs of the common mode feedback amplifiers 6, 8.

Therefore, the common mode amplifiers 6 and 8 are used to control the common mode of the differential gain boosting amplifier 7 and 9 outputs. The positive reference input to the common mode amplifier 6, 8 is the traditional biasing device of a cascode 5, 10. The differential gain boosting output common mode voltage $Vout_p$ and $Vout_n$ can then be tuned using traditional cascode biasing. Single stage amplifier gain is about 8000 or 78 dB (typical PVT).

However, the aforementioned conventional amplifier still limits differential gain boosting to cascodes.

SUMMARY OF THE INVENTION

In view of the foregoing and other exemplary problems, drawbacks, and disadvantages of the conventional methods and structures, an exemplary feature of the present invention is to provide a differential amplifier that extends differential gain boosting to cascoded current mirrors.

An exemplary embodiment of the present invention includes a differential amplifier that includes at least one current mirror, at least one differential pair, at least one cascode, at least one differential gain boosting amplifier for differential current mirror voltage control, and at least one common mode amplifier comprising a common mode voltage to control the output common mode of the differential gain boosting amplifier. The common mode voltage includes a mirrored bias voltage. The mirrored bias voltage feeds directly into the at least one common mode amplifier. A differential input voltage feeds directly into the at least one differential gain boosting amplifier and the at least one differential pair. A gain of the at least one current mirror is boosted by the at least one differential gain boosting amplifier. A differential output voltage is indicative of the differential input voltage with an increase in gain. The differential output voltage is connected to the at least one cascode.

With the introduction of common mode feedback control, differential gain boosting is no longer limited to cascodes. It can now be extended to cascoded current mirrors. In theory, a fully complementary folded cascode could contain 4 differential gain boosting amplifiers. The top and bottom cascodes and top and bottom current mirrors could be gain boosted to maximize the single stage gain.

BRIEF DESCRIPTION OF THE DRAWINGS

The foregoing and other exemplary purposes, aspects and advantages will be better understood from the following detailed description of an exemplary embodiment of the invention with reference to the drawings, in which.

DETAILED DESCRIPTION OF EXEMPLARY EMBODIMENTS OF THE INVENTION

Figure 2:
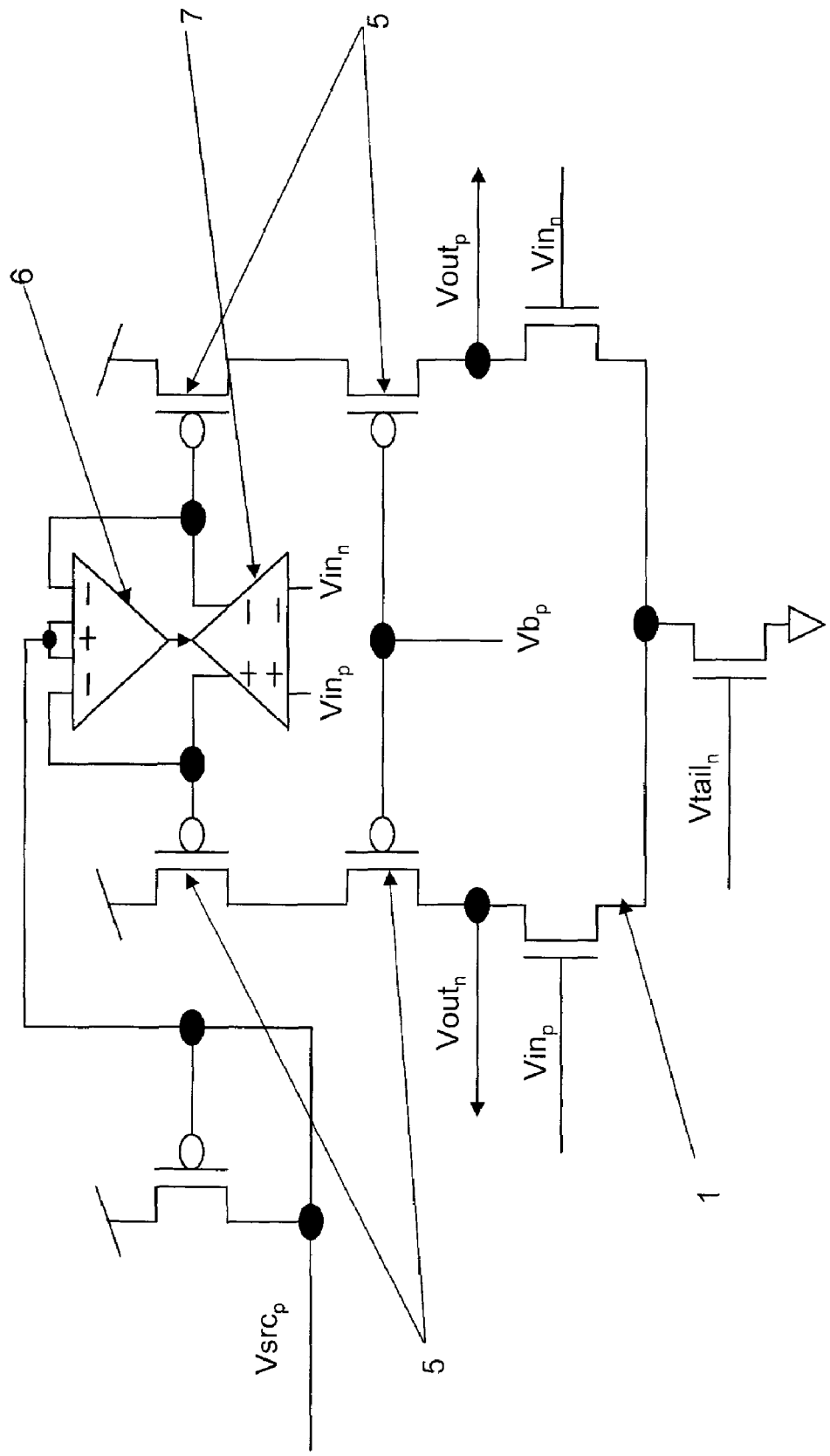
FIG. 2 illustrates an exemplary embodiment of a differential amplifier of the present invention that includes differential gain boosting in cascoded current mirrors.

FIG. 2 represents an exemplary embodiment of a differential amplifier of the present invention that includes differential gain boosting in cascoded current mirrors. $Vin_p$ and $Vin_n$ represent input voltages for an n-MOS differential pair 1. $Vin_p$ and $Vin_n$ are fully differential with respect to each other. A $Vtail_n$ transistor completes the n-MOS differential pair 1. $Vsrc_p$ is a DC bias voltage connected to a common mode feedback amplifier 6.

$Vout_p$ and $Vout_n$ are output voltages of the circuit and are indicative of $Vin_p$ and $Vin_n$ with an increase in gain. $Vout_p$ and $Vout_n$ are each connected to p-MOS cascodes 5. The cascodes 5 increases the gain on $Vout_p$ and $Vout_n$. $Vb_p$ represents a bias voltage that connects directly to the cascode 5 gates. $Vsrc_p$ and $Vb_p$ are both generated from reference currents.

A common mode feedback amplifier 6 and a fully differential high gain amplifier 7 are included in this circuit. Inputs of the amplifier 7 are $Vin_p$ and $Vin_n$. The common mode feedback amplifier 6 sets the common mode voltage around which amplifier 7 swings to $Vsrc_p$. The gates of the current sources 8 are connected to the output of the amplifier 7 and the input of the common mode feedback amplifier 6.

The exemplary circuit shown in FIG. 2 provides gain boosted current mirrors. Also, while the cascode devices do not control the output current, by gain boosting the current mirror devices, a current boost as well as a gain boost is provided. In addition, stability can be increased due to the direct placement of differential inputs $Vin_p$ and $Vin_n$ to the fully differential gain boosting amplifier.

Figure 3:
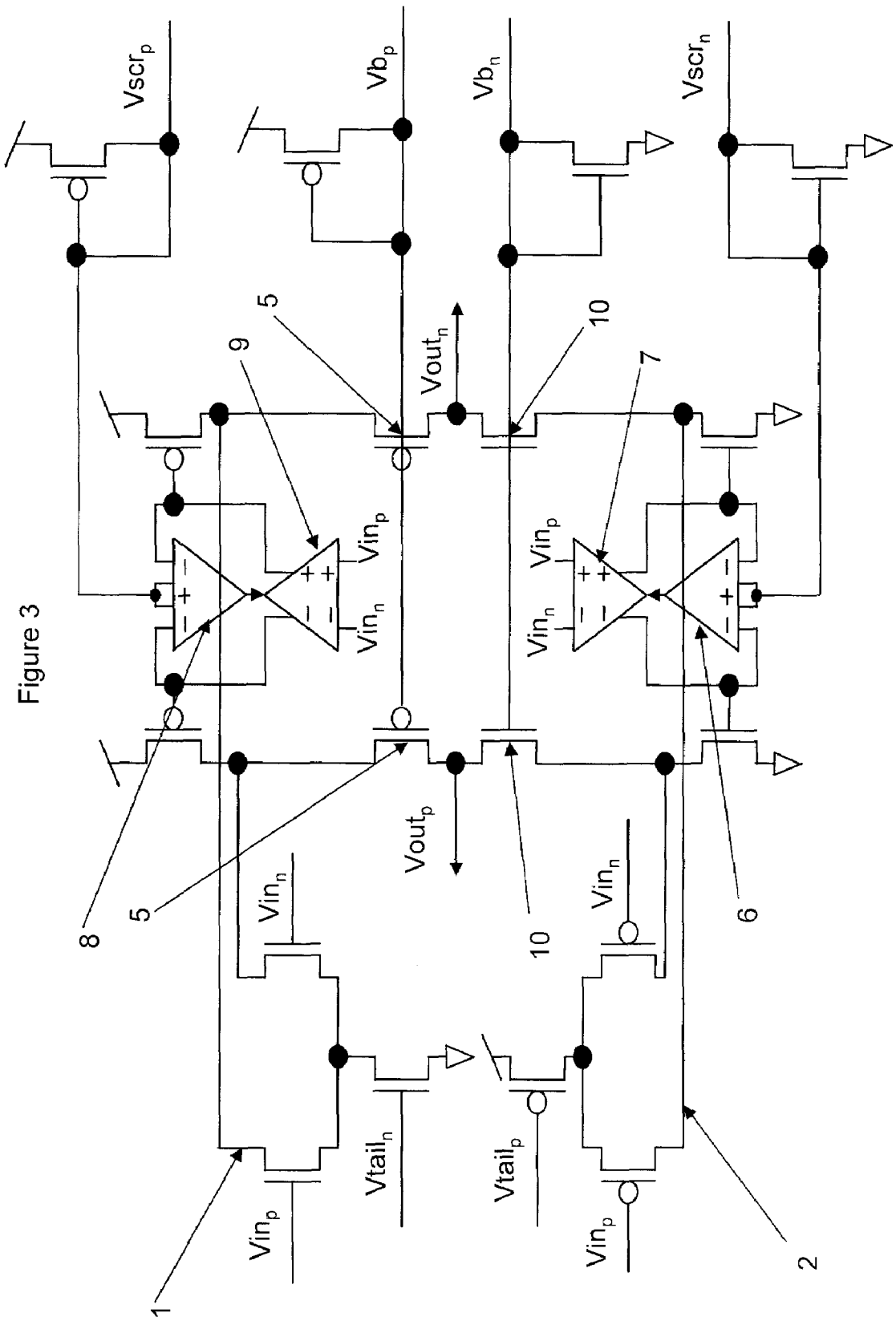
FIG. 3 illustrates a second exemplary embodiment of a differential amplifier of the present invention that includes differential gain boosting in cascoded current mirrors.

FIG. 3 represents a second exemplary embodiment of a differential amplifier of the present invention that includes differential gain boosting in cascoded current mirrors. This takes the gain boosted current mirrors shown in FIG. 2 and described above and applies it to a circuit similar to that shown in FIG. 1 and described above.

Figure 1:
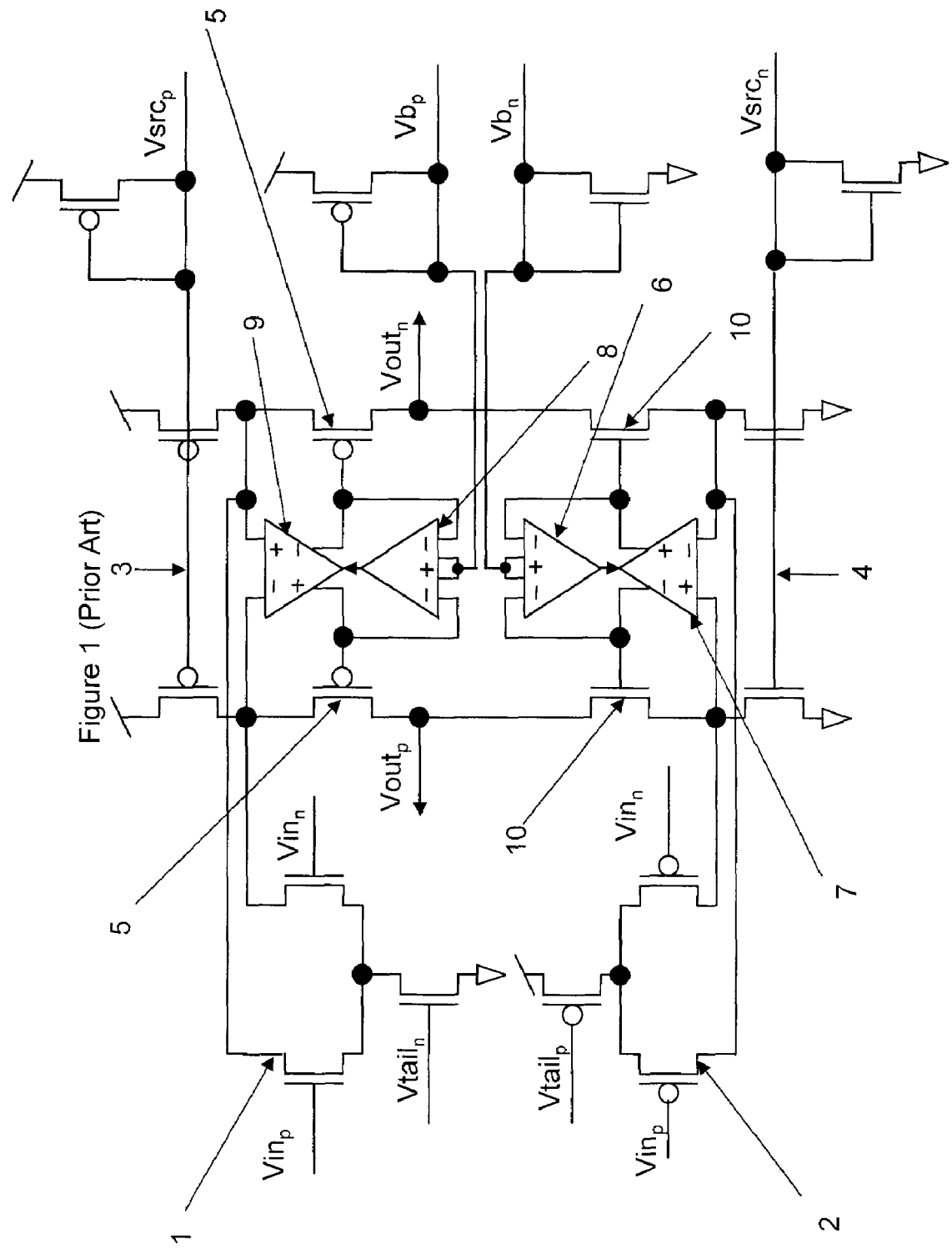
FIG. 1 illustrates conventional fully complementary folded cascode amplifier with differential gain boosting amplifiers.

The circuit in FIG. 3 is similar to the circuit in FIG. 1. However, unlike the circuit in FIG. 1, the gain boosting has been moved from the cascodes 5, 10 to the current sources. $Vsrc_p$ and $Vsrc_n$ are both DC bias voltages feeding directly into the respective inputs of the common mode feedback amplifiers 8 and 6.

This modified configuration provides gain boosted current mirrors. Also, while the cascode devices cannot control output current, by gain boosting the current mirrors, a current boost as well as a gain boost is provided. In addition, stability can be increased due to the placement of inputs $Vin_p$ and $Vin_n$.

Further, with the introduction of common mode feedback control, differential gain boosting is no longer limited to cascodes. It can now be extended to cascoded current mirrors. In theory, a fully complementary folded cascode could contain 4 differential gain boosting amplifiers. The top and bottom cascodes and top and bottom current mirrors could be gain boosted to maximize the single stage gain.

It should be noted that the present invention is not limited to the above exemplary embodiments. For example, gain boosted current mirrors and gain boosted cascodes can both be included in one circuit. Also, gain boosted current mirrors can be extended to any arbitrary circuit that includes fully differential cascoded current mirrors.

It should be noted that other objects, features, and aspects of the present invention will become apparent in the entire disclosure. Modifications may be done without departing from the gist and scope of the present invention as disclosed herein and claimed as appended herewith.

In addition, it should be noted that any combination of the disclosed and/or claimed elements, matters and/or items may fall under the modifications aforementioned.

What is claimed is:

1. A differential amplifier comprising:

at least one current mirror;

at least one differential pair;

at least one cascode;

at least one differential gain boosting amplifier for differential current mirror voltage control; and at least one common mode amplifier comprising a common mode voltage to control an output common mode of said at least one differential gain boosting amplifier, wherein the common mode voltage comprises a mirrored bias voltage, wherein the mirrored bias voltage feeds directly into said at least one common mode amplifier, wherein a differential input voltage feeds directly into said at least one differential gain boosting amplifier and said at least one differential pair, wherein a gain of said at least one current mirror is boosted by said at least one differential gain boosting amplifier, wherein a differential output voltage is indicative of said differential input voltage with an increase in gain, and wherein said differential output voltage is connected to said at least one cascode.

* * * * *